(12) United States Patent
Cho et al.

(10) Patent No.: US 11,322,951 B2
(45) Date of Patent: May 3, 2022

(54) VOLTAGE DETECTION INTEGRATED CIRCUIT AND BATTERY MANAGEMENT SYSTEM INCLUDING SAME

(71) Applicant: SAMSUNG SDI CO., LTD., Yongin-si (KR)

(72) Inventors: Wonkyoung Cho, Yongin-si (KR); Yongchun Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 193 days.

(21) Appl. No.: 16/467,893

(22) PCT Filed: Oct. 19, 2017

(86) PCT No.: PCT/KR2017/011605
§ 371 (c)(1),
(2) Date: Jun. 7, 2019

(87) PCT Pub. No.: WO2018/117387
PCT Pub. Date: Jun. 28, 2018

(65) Prior Publication Data
US 2020/0091735 A1    Mar. 19, 2020

(30) Foreign Application Priority Data

Dec. 22, 2016  (KR) .................. 10-2016-0176862

(51) Int. Cl.
*H02J 7/00* (2006.01)
(52) U.S. Cl.
CPC ........ *H02J 7/0021* (2013.01); *H02J 7/00036* (2020.01); *H02J 7/0069* (2020.01)
(58) Field of Classification Search
CPC .................................................. H02J 7/0021
See application file for complete search history.

(56) References Cited

U.S. PATENT DOCUMENTS

2011/0075712 A1    3/2011  Kuroda et al.
2012/0044010 A1*   2/2012  Murakami ..... H03K 19/017509
                                                    327/333
(Continued)

FOREIGN PATENT DOCUMENTS

CN    103358926 A    10/2013
EP    2 400 626 A2   12/2011
(Continued)

OTHER PUBLICATIONS

Extended European Search Report dated Jul. 8, 2020, of the corresponding European Patent Application No. 17883666.4.
(Continued)

*Primary Examiner* — Robert Grant
(74) *Attorney, Agent, or Firm* — Lee IP Law, PC (57) ABSTRACT

A battery management system may include: a plurality of voltage detection integrated circuits; and a battery controller configured to control charge and discharge of a high voltage battery based on a cell voltage detection result received from the voltage detection integrated circuits, and each of the detection integrated circuits includes: a cell voltage detection circuit configured to detect a voltage of at least one corresponding cell among a plurality of cells constituting the high voltage battery; first and second interfaces configured to communicate between different voltage detection integrated circuits in the detection integrated circuits; a plurality of first terminals connected with a first power source which supplies an operation voltage of the cell voltage detection circuit and the first interface; a plurality of second terminals configured to receive an operation voltage of a different voltage detection integrated circuit connected therewith through the second interface; and a level shifter configured to level-shift a voltage supplied from the first power source based on the operation voltage inputted through the second (Continued)

terminals to supply the level-shifted voltage as an operation voltage of the second interface.

9 Claims, 6 Drawing Sheets

(56) References Cited

U.S. PATENT DOCUMENTS

| | | | |
|---|---|---|---|
| 2013/0110430 A1 | 5/2013 | Nishi et al. | |
| 2013/0257441 A1 | 10/2013 | Sekiguchi | |
| 2013/0335096 A1* | 12/2013 | Hasenkopf | G01R 31/3835 |
| | | | 324/434 |
| 2014/0191765 A1* | 7/2014 | Takeshita | B60L 58/18 |
| | | | 324/434 |
| 2014/0312913 A1 | 10/2014 | Kikuchi et al. | |
| 2015/0102943 A1 | 4/2015 | De Greef et al. | |
| 2015/0241520 A1 | 8/2015 | Ohtake | |

FOREIGN PATENT DOCUMENTS

| | | |
|---|---|---|
| GB | 2467231 A | 7/2010 |
| JP | 2003-243015 A | 8/2003 |
| JP | 2010-178400 A | 8/2010 |
| JP | 2012-044768 A | 3/2012 |
| JP | 2012-065518 A | 3/2012 |
| JP | 2015-076890 A | 4/2015 |
| JP | 2015-159689 A | 9/2015 |
| KR | 10-2013-0065351 A | 6/2013 |

OTHER PUBLICATIONS

S. Yeo et al., "Design of DC Level Shifter for Daisy Chain Interface", Journal of the KIECS, vol. 11, No. 5, 2016, pp. 479-484.
International Search Report for PCT/KR2017/011605 filed Oct. 19, 2017.
Korean Notice of Allowance dated Mar. 2, 2021.
European Office Action dated Sep. 24, 2021.
Chinese Office action and Search Report dated Jan. 24, 2022.

* cited by examiner

VOLTAGE DETECTION INTEGRATED CIRCUIT AND BATTERY MANAGEMENT SYSTEM INCLUDING SAME

CROSS-REFERENCE TO THE RELATED APPLICATION

This is the U.S. national phase application based on PCT Application No. PCT/KR2017/011605, filed Oct. 19, 2017, which is based on Korean Patent Application No. 10-2016-0176862, filed Dec. 22, 2016, the entire contents of all of which are hereby incorporated by reference.

TECHNICAL FIELD

An exemplary embodiment relate to a voltage detection integrated circuit, and a battery management system including the same.

BACKGROUND ART

Recently, according to strengthening of environmental regulations including $CO_2$ regulations, interest in environmentally-friendly vehicles has been increasing. Accordingly, vehicle companies have been actively researching and developing pure electrical vehicles and hydrogen vehicles, as well as hybrid and plug-in hybrid vehicles.

A high voltage battery for storing electrical energy obtained from various energy sources is applied to the environmentally-friendly vehicles. A high voltage battery includes a plurality of cells in series or in parallel to provide high voltage electrical energy.

A battery management system (BMS) for managing a high voltage battery is mounted in a vehicle to which the high voltage battery is applied. A cell balancing function which compensates a voltage deviation between cells by monitoring the voltage of each of the cells is one of the main functions of the battery management system. The voltage of each cell constituting the high voltage battery may be measured by an integrated circuit (IC), e.g., an analog front end (AFE) IC, having a built-in voltage detection circuit.

DC levels may be different between ICs measuring cell voltages because of the structure of a high voltage battery in which a plurality of cells are stacked. For this reason, an isolator is essentially used for communication between voltage measurement ICs having different DC levels, and the use of an isolator increases a cost of the battery management system.

DISCLOSURE

Technical Problem

An exemplary embodiment has been made in an effort to provide a battery management system that minimizes the use of an isolator.

Technical Solution

An exemplary embodiment of the present invention provides a battery management system including: a plurality of voltage detection integrated circuits; and a battery controller configured to control charge and discharge of a high voltage battery based on a cell voltage detection result received from the voltage detection integrated circuits, and each of the detection integrated circuits includes: a cell voltage detection circuit configured to detect a voltage of at least one corresponding cell among a plurality of cells constituting the high voltage battery; first and second interfaces configured to communicate between different voltage detection integrated circuits in the detection integrated circuits; a plurality of first terminals connected with a first power source which supplies an operation voltage of the cell voltage detection circuit and the first interface; a plurality of second terminals configured to receive an operation voltage of a different voltage detection integrated circuit connected therewith through the second interface; and a level shifter configured to level-shift a voltage supplied from the first power source based on the operation voltage inputted through the second terminals to supply the level-shifted voltage as an operation voltage of the second interface.

In the battery management system, the first terminals may be connected with the second terminals of another voltage detection integrated circuit connected through the first interface among the plurality of voltage detection integrated circuits.

In the battery management system, the first power source may be provided from the corresponding at least one cell.

The battery management system may further include a transceiver configured to transmit and receive signals between the voltage detection integrated circuits and the battery controller, and an isolator connected between the transceiver and the second interface of one of the voltage detection circuits.

In the battery management system, the level shifter may be deactivated in a voltage detection integrated circuit connected to the isolator among the plurality of voltage detection integrated circuits.

In the battery management system, the first and second interfaces may communicate with other voltage detection integrated circuits in a daisy-chain method.

An exemplary embodiment of the present invention provides an integrated circuit including: a cell voltage detection circuit configured to detect a cell voltage of at least one cell; first and second interfaces configured to communicate with other integrated circuits; a plurality of first power terminals connected with a first power source which supplies an operation voltage to the cell voltage detection circuits and the first interface; a plurality of second power terminals; and a level shifter configured to level-shift a voltage supplied from the first power source based on a voltage inputted through the second power terminals to supply the level-shifted voltage as an operation voltage of the second interface.

In the integrated circuit, the second power terminals may be connected to power terminals of other integrated circuits that perform communication through the second interface.

In the integrated circuit, the first power source may be provided from at least one cell connected to the cell voltage detection circuit.

In the integrated circuit, the first and second interfaces may communicate with other voltage detection integrated circuits in a daisy-chain method.

Advantageous Effects

According to the exemplary embodiment of the present invention, it is possible to provide the battery management system which is capable of suppressing a unit price increase by minimizing the use of the isolator.

MODE FOR INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

To clearly describe the exemplary embodiments, parts that are irrelevant to the description are omitted, and like numerals refer to like or similar constituent elements throughout the specification. Therefore, the reference numbers of the constituent elements used in a previous drawing may be used in a next drawing.

Further, since sizes and thicknesses of constituent members shown in the accompanying drawings are arbitrarily given for better understanding and ease of description, the exemplary embodiments are not limited to the illustrated sizes and thicknesses. In the drawings, the thickness of layers, films, panels, regions, etc., are exaggerated for clarity.

A case of electrically connecting two constituent elements includes not only a case of directly connecting the constituent elements but also a case of connecting the constituent elements via another constituent element therebetween. The constituent element therebetween may include a switch, a resistor, a capacitor, and the like. In describing exemplary embodiments, an expression of connection indicates electrical connection unless explicitly described to be direct connection.

Hereinafter, a voltage detection integrated circuit (IC) according to exemplary embodiments and a battery management system including the same will be described in detail with reference to the drawings. In this document, the voltage detection IC may include an analog front end (AFE) IC including a cell voltage detection function of a battery, a cell voltage monitoring (CVM) IC, and the like.

Figure 1:
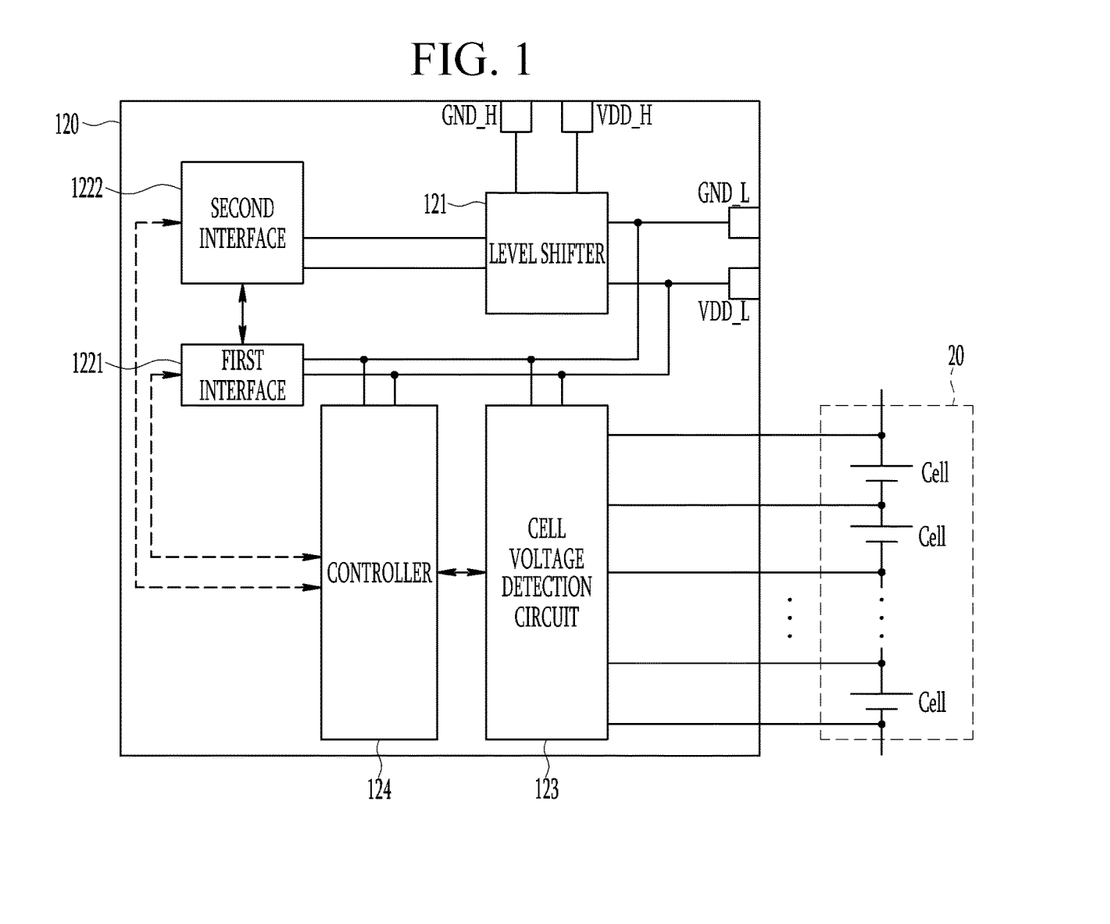
FIG. 1 schematically illustrates a voltage detection IC according to an exemplary embodiment.

FIG. 1 schematically illustrates a voltage detection IC according to an exemplary embodiment.

Referring to FIG. 1, a voltage detection IC 120 according to the present exemplary embodiment may include a level shifter 121, communication circuits 1221 and 1222, a cell voltage detection circuit 123, a controller 124, and a plurality of power terminals GND_L, VDD_L GND_H, and VDD_H.

Figure 2:
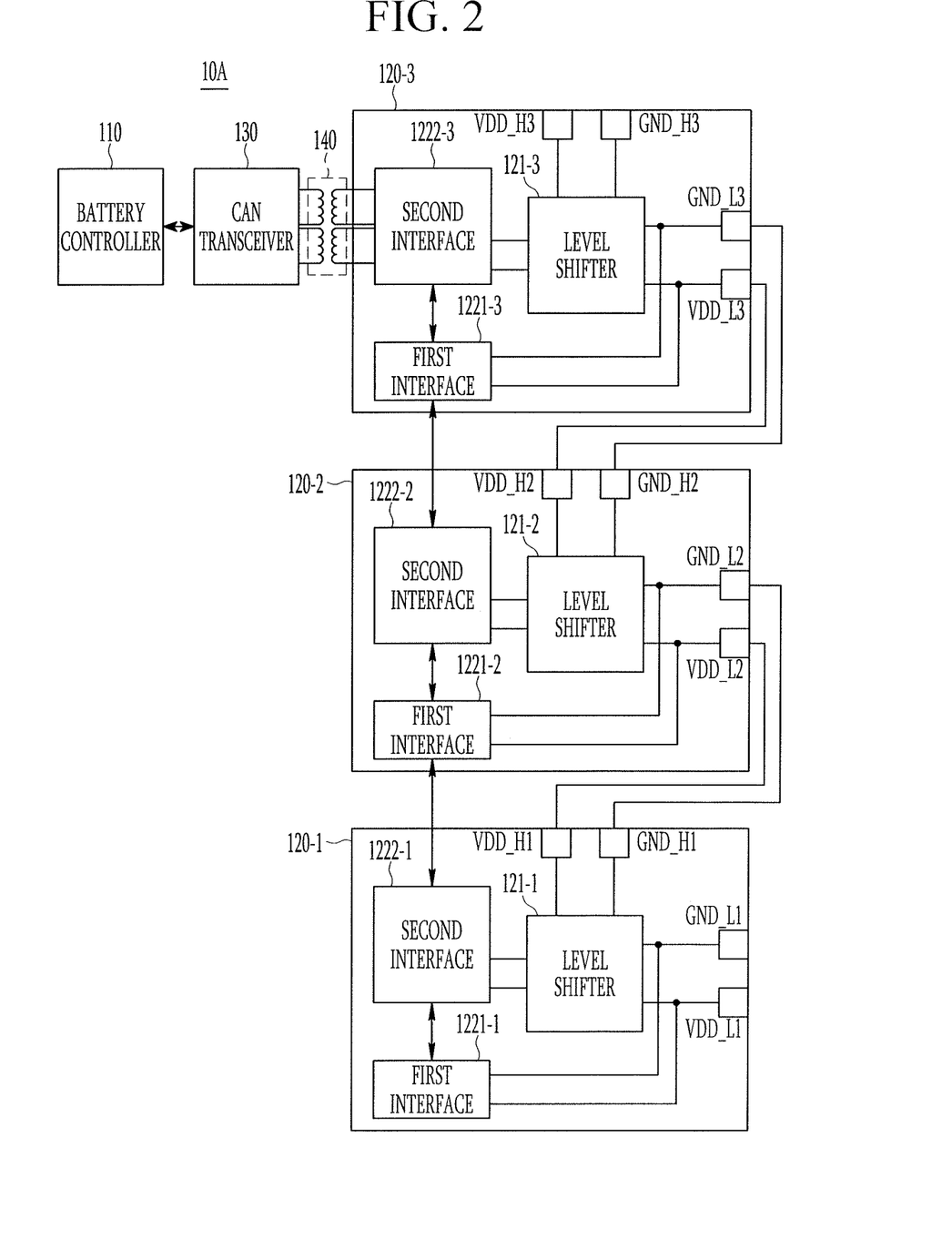
FIG. 2 illustrates an example of a battery management system including a voltage detection IC according to an exemplary embodiment.

Each of the communication circuits serves to communicate with another voltage detection IC or a battery controller (see reference numeral 110 in FIG. 2). The communication circuits may include a plurality of interfaces 1221 and 1222 communicating with a different voltage detection IC or a battery controller (see reference numeral 110 in FIG. 2).

Each of the interfaces 1221 and 1222 may be a daisy chain interface that communicates with a communication circuit of another voltage detection IC by a daisy chain method.

The cell voltage detection circuit 123 may be electrically connected to at least one cell constituting a cell stack 20, and a cell voltage of each of the cells may be measured. The cell voltage detection circuit 123 may include an analog-to-digital converter (ADC) for converting the cell voltage of each cell detected as an analog value into a digital value.

The controller 124, which is a controller in the IC, may control the cell voltage detection circuit 123 and a daisy chain communication circuit. For example, the cell voltage detection circuit 123 may be controlled to select a target cell, a voltage of which is to be detected, among the cells constituting the cell stack 20. Further, for example, the cell voltage detected by the cell voltage detection circuit 123 may be transferred to the battery controller (see reference numeral 110 in FIG. 2) through the daisy chain communication circuit.

Different power supplies are connected to the first power terminals GND_L and VDD_L and the second power terminals GND_H and VDD_H. For convenience of description, hereinafter, the power source that is connected to the first power terminals GND_L and VDD_L is referred to as a first power source, and the power source that is connected to the second power terminals GND_H and VDD_H is referred to as a second power source.

The first power source, which is a main operation power source, supplies an operation voltage to the ADC of the cell voltage detection circuit 123, the controller 124, and the first interface 1221 of the voltage detection IC 120.

The first power source may be provided from a power supply circuit outside the voltage detection IC 120, or may be provided from a power supply circuit inside the voltage detection IC 120. In the latter case, the power supply circuit in the voltage detection IC 120 can provide the first power source by transforming the cell voltage supplied from at least one cell of the cell stack 20.

The second power source is a power source that is a reference for level shifting of the level shifter 121.

As the second power, the first power of another voltage detection IC may be used. In this case, the second power terminals GND_H and VDD_H may be connected to the first power terminals GND_L and VDD_L of the voltage detection IC to be communicated through the second interface 1222. The second power may be a common power that is commonly supplied to all the voltage detection ICs. In this case, the second power terminals GND_H and VDD_H may be connected to the second power terminals GND_H and VDD_H of another voltage detection IC.

The level shifter 121 may receive the first power and the second power from the first power terminals GND_L and VDD_L and the second power terminals GND_H and VDD_H, to level-shift a reference potential (DC level) of the first power to a reference potential (DC level) of the second power. That is, the level shifter 121 may level-shift the operation voltage supplied from the first power source to the operation voltage of the second power source.

The operation voltage level-shifted by the level shifter 121 may be supplied as the operation voltage of the second interface 1222.

Accordingly, the second interface 1222 of the voltage detection IC 120 may be operated by receiving an operation voltage of a same level as that of the voltage detection IC to be communicated by the level shifter 121, so that communication between the voltage detection IC 120 and another voltage detection IC may be performed without an isolator.

Figure 3:
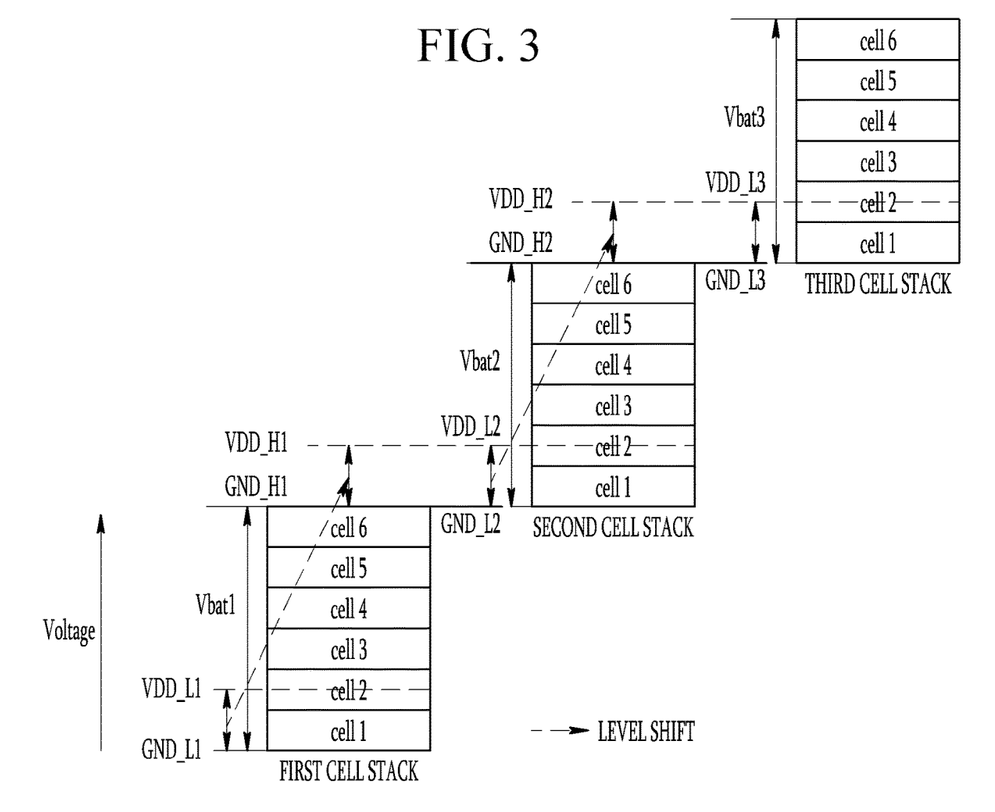
FIG. 3 illustrates a view for describing an operation of the battery management system of FIG. 2

FIG. 2 illustrates an example of a battery management system including a voltage detection IC according to an exemplary embodiment, and FIG. 3 illustrates a view for describing an operation of the battery management system of FIG. 2

Referring to FIG. 2, a battery management system 10A according to a first exemplary embodiment may include a battery controller 110, a plurality of voltage detection ICs 120-1, 120-2, and 120-3, a transceiver 130, and an isolator 140. Although a case where the battery management system 10A includes three voltage detection ICs is illustrated as an example in FIG. 2, the present invention is not limited thereto, and a number of voltage detection ICs included in the battery management system 10A may be more or less than three.

The battery controller 110 may receive a cell voltage of each cell constituting a high voltage battery (not shown) from the voltage detection ICs 120-1, 120-2, and 120-3, to control charging and discharging of the respective cells or the high voltage battery.

The voltage detection ICs 120-1, 120-2, and 120-3 may be respectively connected to cell stacks (see reference numeral 20 in FIG. 1) connected in series with each other, to detect a cell voltage of each cell constituting a corresponding cell stack.

The voltage detection ICs 120-1, 120-2, and 120-3 respectively include first and second interfaces 1221-1, 1221-2, and 1221-3, and 1222-1, 1222-2, and 1222-3, and level shifters 121-1, 121-2, and 121-3.

The first interfaces 1221-1, 1221-2, and 1221-3 may respectively receive operation voltages through the first power terminals GND_L1 and VDD_L1, GND_L2 and VDD_L2, and GND_L3 and VDD_L3.

The second interfaces 1222-1, 1222-2, and 1222-3 may respectively receive operation voltages from the level shifters 121-1, 121-2, and 121-3.

The level shifters 121-1, 121-2, and 121-3 respectively level-shift and output voltages supplied to the first power terminals GND_L1 and VDD_L1, GND_L2 and VDD_L2, and GND_L3 and VDD_L3 based on voltages inputted through the second power terminals GND_H1 and VDD_H1, GND_H2 and VDD_H2, and GND_H3 and VDD_H3 of the voltage detection ICs 120-1, 120-2, and 120-3. The voltages level-shifted by the level shifters 121-1, 121-2, and 121-3 may be respectively supplied as operation voltages of the corresponding second interfaces 1222-1, 1222-2, and 1222-3.

The first interface 1221-1 of the first voltage detection IC 120-1 receives a voltage applied to the first power terminals GND_L1 and VDD_L1 as an operation voltage. The second interface 1222-1 receives a voltage that is level-shifted through the level shifter 121-1 as the operation voltage. The second power terminals GND_H1 and VDD_H1 are connected to the first power terminals GND_L2 and VDD_L2 of the second voltage detection IC 120-2 which is an upper voltage detection IC of the first voltage detection IC 120-1, to receive an operation voltage of the first interface 1221-2 of the second voltage detection IC 120-2. Accordingly, the level shifter 121-1 may supply a voltage that is level-shifted to the operation voltage of the first interface 1221-2 of the second voltage detection IC 120-2 as an operation voltage of the second interface 1222-1.

For example, referring to FIG. 3, a potential difference occurs between main operation voltages of the first voltage detection IC 120-1 and the second voltage detection IC 120-2 by an output voltage Vbat1 of the first cell stack connected with the first voltage detection IC 120-1. Accordingly, the level shifter 121-1 of the first voltage detecting IC 120-1 level-shifts a voltage applied to the first power terminals GND_L1 and VDD_L1 by the output voltage Vbat1 of the first cell stack to supply it as an operation voltage of the second interface 1222-1.

This enables communication between the second interface 1222-1 of the first voltage detection IC 120-1 and the first interface 1221-2 of the second voltage detection IC 120-2 without an isolator.

In this document, in describing positions between the voltage detection ICs, 'upper' or 'lower' may be defined depending on positions in the high voltage battery of the cell stack connected with each of the voltage detection IC. For example, when a cell stack connected to the first voltage detection IC 120-1 is connected closer to the ground than a cell stack connected to the second voltage detection IC 120-2, the first voltage detection IC 120-1 may be expressed as a lower voltage detection IC of the second voltage detection IC 120-2, and the second voltage detection IC 120-2 may be expressed as an upper voltage detection IC of the first voltage detection IC 120-1.

Referring again to FIG. 2, the first interface 1221-2 of the second voltage detection IC 120-2 receives a voltage applied to the first power terminals GND_L2 and VDD_L2 as an operation voltage. The second interface 1222-2 receives a voltage that is level-shifted through the level shifter 121-2 as the operation voltage. The second power terminals GND_H2 and VDD_H2 are connected to the first power terminals GND_L3 and VDD_L3 of the second voltage detection IC 120-3 which is an upper voltage detection IC of the first voltage detection IC 120-2, to receive an operation voltage of the first interface 1221-3 of the third voltage detection IC 120-3. Accordingly, the level shifter 121-2 may supply a voltage that is level-shifted to the operation voltage of the first interface 1221-3 of the third voltage detection IC 120-2 as an operation voltage of the second interface 1222-1.

For example, referring to FIG. 3, a potential difference occurs between main operation voltages of the second voltage detection IC 120-2 and the third voltage detection IC 120-3 by an output voltage Vbat2 of the second cell stack connected with the second voltage detection IC 120-2. Accordingly, the level shifter 121-2 of the second voltage detecting IC 120-2 level-shifts a voltage applied to the first power terminals GND_L2 and VDD_L2 by the output voltage Vbat2 of the second cell stack to supply it as an operation voltage of the second interface 1222-2.

This enables communication between the second interface 1222-2 of the first voltage detection IC 120-2 and the first interface 1221-3 of the third voltage detection IC 120-3 without an isolator.

Referring again to FIG. 2, the third voltage detection IC 120-3 is the voltage detection IC of a final stage which is most closely connected to the battery controller 110 in a daisy chain bus, and thus the level shifter 121-3 for communicating with the upper voltage detection IC is inactivated. Thus, both the first interface 1221-3 and the second interface 1222-3 of the third voltage detecting IC 120-3 receive a voltage applied to the first power terminals GND_L2 and VDD_L2 as an operation voltage.

The second interface 1222-2 of the third voltage detection IC 120-3 communicates with the battery controller 110 via the transceiver 130 and the isolator 140, since the third voltage detection IC 120-3 is disposed at the final stage of the daisy chain bus.

The transceiver 130 may transmit and receive signals to and from the battery controller 110 through a serial peripheral interface (SPI). FIG. 2 shows an example in which the SPI is a controller area network (CAN) communication.

A potential difference exists between operation voltages of the transceiver 130 and the third voltage detecting IC 120-3 so that an isolator 140 for solving the potential difference may be connected between the transceiver 130 and the second interface 1222-2 of the third voltage detection IC 120-3.

Although a case where the third voltage detection IC 120-3 is connected to an uppermost cell stack of the high voltage battery so that the level shifters 121-1 and 121-2 of the first and second voltage detection ICs 120-1 and 120-2 up-shift voltage levels is described as an example in FIG. 2 and FIG. 3, the present invention is not limited thereto, and the third voltage detection IC 120-3 may be connected to a lowermost cell stack of the high voltage battery. In this case, the level shifters 121-1 and 121-2 of the first and second voltage detection ICs 120-1 and 120-2 may down-shift the voltage levels depending on the operation voltage of lower voltage detection ICs thereof so as to supply them as operation voltages of the second interfaces 1222-1 and 1222-2.

In addition, although a case where a voltage detection IC (the third voltage detection IC 120-3 of FIG. 3) connected to the uppermost cell stack is disposed at the final stage of the daisy chain bus to communicate with the battery controller 110 is described as an example in FIG. 2 and FIG. 3, the present invention is not limited thereto. According to another exemplary embodiment, a voltage detection IC (the first voltage detection IC 120-1 in the case of FIG. 2) connected to the lowermost cell stack may be disposed at the final stage of the daisy chain bus to communicate with the battery controller 110. In this case, the battery controller 110 may be connected to the first interface 1221-1 of the voltage detection IC 120-1 connected to the lowermost cell stack through the transceiver 130 and the isolator 140. As described above, the battery management system 10A does not need to use an isolator for communication between the voltage detection ICs 120-1, 120-2, and 120-3. Therefore, the number of isolators mounted in the battery management system 10A may be minimized, thereby reducing the cost.

Recently, a method for applying a system in package (SIP) technology to a voltage detection IC has been studied to improve channel scalability. The SIP is a technology for packaging a plurality of voltage detecting ICs into a single chip package, which is advantageous in that the development cost is low and the chip configuration of various channels is easy.

Figure 4:
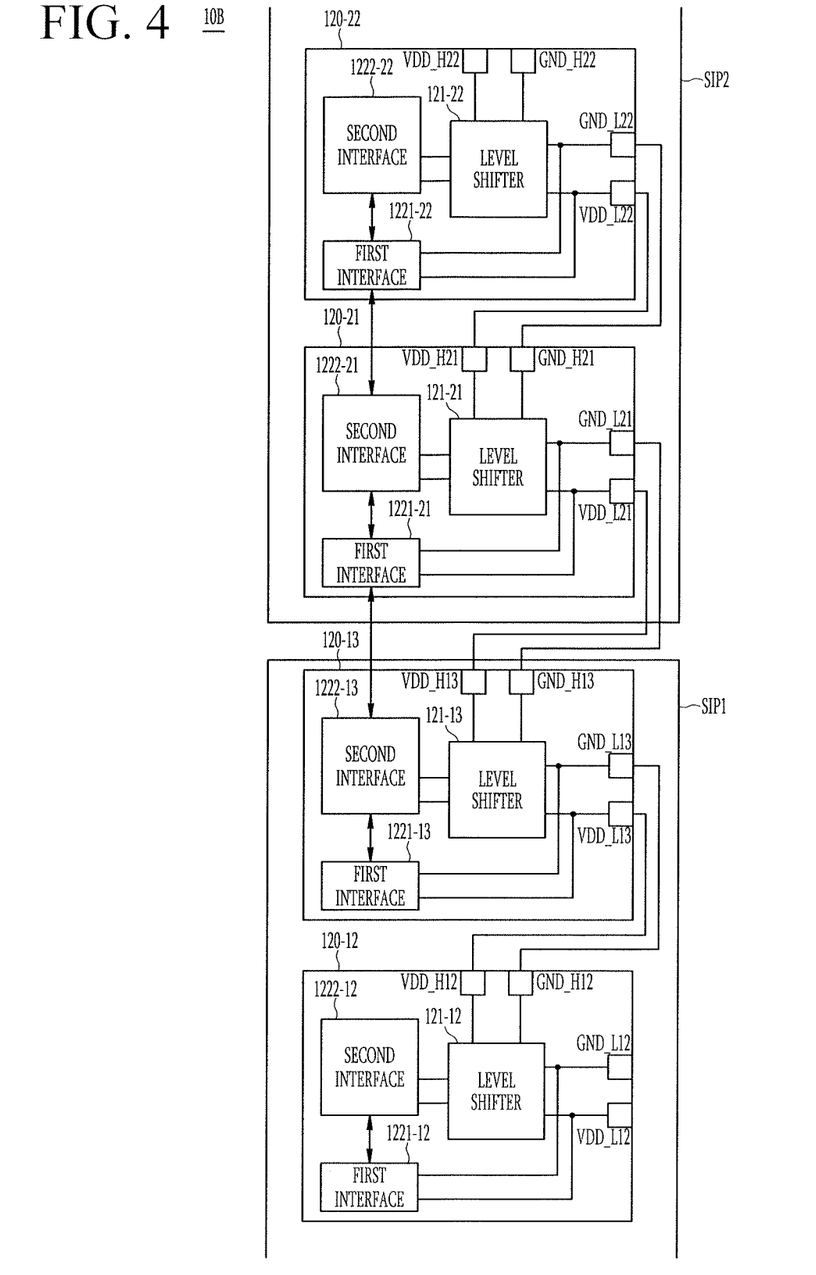
FIG. 4 illustrates another example of a battery management system including a voltage detection IC according to an exemplary embodiment.

FIG. 4 illustrates another example of a battery management system including a voltage detection IC, to which SIP technology is applied, according to an exemplary embodiment.

Referring to FIG. 4, the battery management system 10B includes a plurality of voltage detection IC packages SIP1 and SIP2, and each of the voltage detection IC packages SIP1 and SIP2 may be configured by packaging a plurality of voltage detection ICs (120-12, 120-13, 120-21, 120-22, . . . ).

The voltage detecting ICs included in one voltage detecting IC package SIP1 or SIP2 may communicate with each other without an isolator by using the level shift method described with reference to FIG. 1 to FIG. 3 described above.

For example, the voltage detection IC 120-21 of the second voltage detection IC package SIP2 receives an operation voltage of the upper voltage detection IC 120-22 from its upper voltage detection IC 120-22, and level-shifts a main operation voltage of the voltage detection IC 120-21 based on the received operation voltage. In addition, it is possible to communicate with the voltage detection IC without an isolator by supplying the level-shifted voltage as an operation voltage of the second interface 1222-21 which communicates with the voltage detection IC 120-22.

Even when communication is desired to be performed between the voltage detection IC packages SIP1 and SIP2 without an isolator in a battery management system 10B, the communication may be performed therebetween without an isolator by using the level shift method described with reference to FIG. 1 to FIG. 3. In this case, a main operation voltage of the lowermost voltage detection IC 120-21 of the second voltage detection IC package SIP2 is supplied to a level shifter 121-13 of the uppermost voltage detection IC 120-13 of the first voltage detection IC package SIP1. Accordingly, the level shifter 121-13 of the voltage detection IC 120-3 level-shifts a main operation voltage of the voltage detection IC 120-13 based on the main operation voltage of the lowermost voltage detection IC 120-21 or the second voltage detection IC package SIP2. In addition, the communication between the voltage detection IC packages SIP1 and SIP2 may be performed without an isolator by supplying the level-shifted voltage as an operation voltage of the second interface 1222-3 which communicates with the second voltage detection IC package SIP2.

As described above, according to an exemplary embodiment, a voltage detection IC (see reference numeral 120 in FIG. 1) may be expanded and applied to a case where a plurality of voltage detection ICs are packaged in one SIP as well as the case where one voltage detection IC is packaged in one package.

Figure 5:
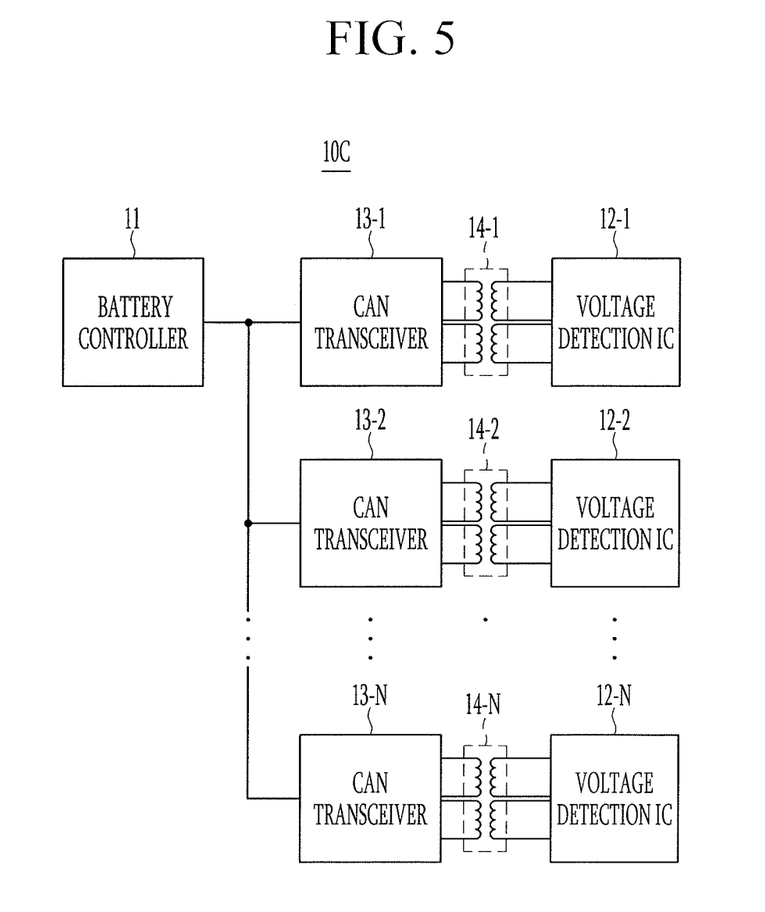
FIG. 5 schematically illustrates a battery management system according to a conventional art.
Figure 6:
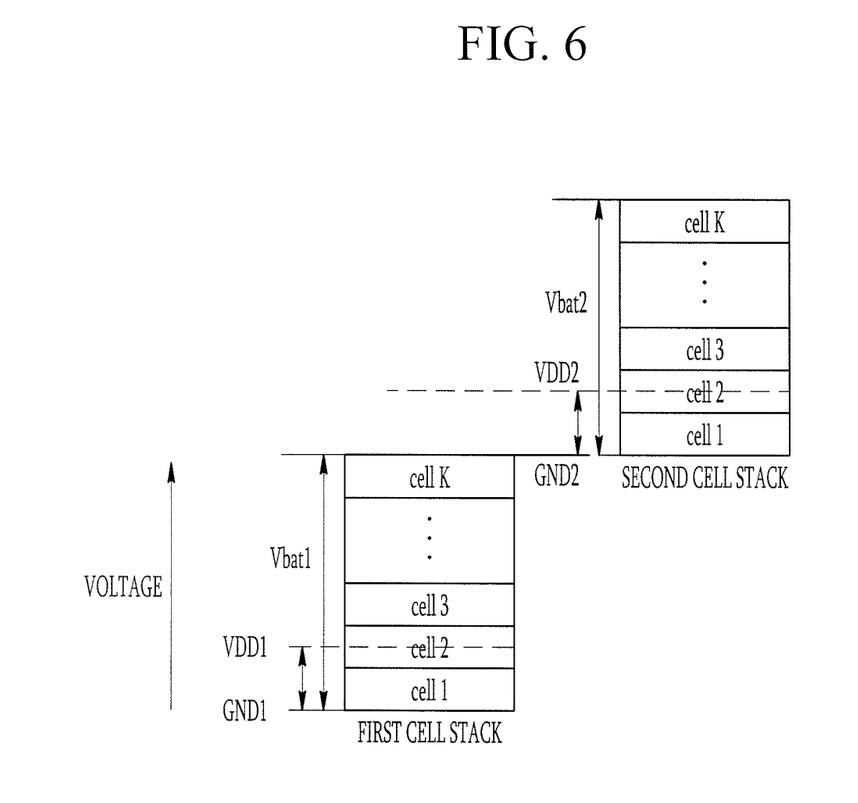
FIG. 6 illustrates a view for describing a reference potential difference between voltage detection ICs according to the conventional art.

FIG. 5 schematically illustrates a battery management system according to a conventional art. FIG. 6 illustrates a view for describing a reference potential difference between voltage detection ICs according to the conventional art.

Referring to FIG. 5, a conventional battery management system 10C includes a battery controller 11, a plurality of voltage detection ICs 12-1, 12-2, . . . , 12-N, a plurality of CAN transceivers 13-1 and 13-2 . . . , 13-N and a plurality of isolators 14-1, 14-2, . . . , 14-N.

The battery controller 10 receives a cell voltage of each cell constituting a high voltage battery (not illustrated) from the voltage detection ICs 12-1, 12-2, . . . , and 12-N, to control charging and discharging of the high voltage battery.

Each of voltage detection ICs 12-1, 12-2, . . . , and 12-N is connected to a different cell stack, and includes a cell voltage detection circuit (not illustrated) for detecting a cell voltage of each cell constituting the corresponding cell stack.

The cell stacks connected to the voltage detection ICs 12-1, 12-2, . . . , and 12-N are connected in series to each other to constitute a high-voltage battery. Accordingly, reference potentials (DC levels) of the operation voltages may be different from each other between in view of a characteristic of the voltage detection ICs 12-1, 12-2, . . . , and 12-N which receive operation voltages from the output voltages of the corresponding cell stack.

For example, referring to FIG. 6, each of the first and second cell stacks connected in series to each other include K cells connected in series with each other. Therefore, a reference potential GND2 of the second cell stack is higher than a reference potential GND1 of the first cell stack by K cell voltages Vbat11. Since the reference potentials GND1 and GND2 corresponding to the first and second cell stacks are different from each other, a potential difference is generated between the power voltages VDD1 and VDD2 of the voltage detection ICs corresponding to the respective cell stacks.

As the potential difference is generated between the voltage detecting ICs 12-1, 12-2, . . . , and 12-N as described above, the voltage detection ICs 12-1, 12-2 . . . . , and 12-N respectively include can transceivers CAN transceivers 13-1, 13-2 . . . . , and 13-N and isolators 14-1, 14-2, . . . , and 14-N in the battery management system 10C according to the conventional art. That is, when N voltage detection ICs 12-1, 12-2, . . . , and 12-N are included in the battery management system 10C, the battery management system 10C needs to include N CAN transceivers 13-1, 13-2, . . . , and 13-N and N isolators 14-1, 14-2, . . . , and 14-N in order to perform the communication between the voltage detection ICs 12-1, 12-2, . . . , and 12-N.

As described above, when a CAN transceiver and an isolator are provided for each of the voltage detection ICs, the use of a comparatively expensive isolator increases, and thus the unit price of the battery management system rises.

In contrast, in accordance with the battery management system according to the exemplary embodiment described with reference to FIG. 1 to FIG. 4, it is possible to reduce the cost of the battery management system by decreasing the use of the isolator compared to the conventional art.

While exemplary embodiments of the present invention have been particularly shown and described with reference to the accompanying drawings, the specific terms used herein are only for the purpose of describing the invention and are not intended to define the meanings thereof or be limiting of the scope of the invention set forth in the claims. Therefore, those skilled in the art will understand that various modifications and other equivalent embodiments of the present invention are possible. Consequently, the true technical protective scope of the present invention must be determined based on the technical spirit of the appended claims.

DESCRIPTION OF SYMBOLS

10A, 10B: battery management system
110: battery controller
120: voltage detection integrated circuit
121: level shifter
1221, 1222: interface
123: cell voltage detection circuit
124: controller
130: transceiver
140: isolator

The invention claimed is:

1. A battery management system, comprising:
a plurality of voltage detection integrated circuits, the plurality of voltage detection integrated circuits including at least a first voltage detection integrated circuit and a second voltage detection integrated circuit; and
a battery controller configured to control charge and discharge of a high voltage battery based on a cell voltage detection result received from the plurality of voltage detection integrated circuits, wherein:
each of the plurality of voltage detection integrated circuits includes:
a cell voltage detection circuit configured to detect a voltage of at least one corresponding cell among a plurality of cells constituting the high voltage battery;
first and second interfaces configured to communicate between different voltage detection integrated circuits in the plurality of voltage detection integrated circuits;
a plurality of first terminals connected with a first power source which supplies an operation voltage of the cell voltage detection circuit and the first interface, the first power source being supplied from the at least one corresponding cell;
a plurality of second terminals configured to receive an operation voltage of a different voltage detection integrated circuit connected therewith through the second interface; and
a level shifter configured to level-shift a voltage supplied from the first power source to a level of the operation voltage inputted through the second terminals to supply the level-shifted voltage as an operation voltage of the second interface,
the first voltage detection integrated circuit is a lower potential voltage detection integrated circuit than the second voltage detection integrated circuit, and
the level shifter of the first voltage detection integrated circuit is configured to supply a voltage, which is level-shifted to the operation voltage of the first interface of the second voltage detection integrated circuit, as an operation voltage of the second interface of the first voltage detection integrated circuit.

2. The battery management system of claim 1, wherein the first terminals are connected with the second terminals of another voltage detection integrated circuit connected through the first interface among the plurality of voltage detection integrated circuits.

3. The battery management system of claim 1, further comprising:
a transceiver configured to transmit and receive signals between the voltage detection integrated circuits and the battery controller; and
an isolator connected between the transceiver and the second interface of one of the voltage detection circuits.

4. The battery management system of claim 3, wherein the level shifter is deactivated in a voltage detection integrated circuit connected to the isolator among the plurality of voltage detection integrated circuits.

5. The battery management system of claim 1, wherein the first and second interfaces communicate with other voltage detection integrated circuits in a daisy-chain method.

6. An integrated circuit, comprising:
a cell voltage detection circuit configured to detect a cell voltage of at least one cell;
first and second interfaces configured to communicate with other integrated circuits;
a plurality of first power terminals connected with a first power source which supplies an operation voltage to the cell voltage detection circuits and the first interface;
a plurality of second power terminals; and
a level shifter coupled to the first power source and a second power source, which is a power source that is a reference for level shifting,
wherein the level shifter is configured to level-shift a reference potential of the first power source to a reference potential of the second power source as an operation voltage of the second interface.

7. The integrated circuit of claim 6, wherein the second power terminals are connected to power terminals of other integrated circuits that perform communication through the second interface.

8. The integrated circuit of claim 6, wherein
the first power source is supplied from at least one cell connected to the cell voltage detection circuit.

9. The integrated circuit of claim 6, wherein
the first and second interfaces communicate with other voltage detection integrated circuits in a daisy-chain method.

* * * * *